(12) United States Patent
Adjesson

(10) Patent No.: US 11,799,999 B2
(45) Date of Patent: Oct. 24, 2023

(54) PROTECTIVE CORNER APPARATUS FOR PORTABLE MOBILE DEVICES

(71) Applicant: Eric Adjesson, Stone Mountain, GA (US)

(72) Inventor: Eric Adjesson, Stone Mountain, GA (US)

( * ) Notice: Subject to any disclaimer, the term of this patent is extended or adjusted under 35 U.S.C. 154(b) by 386 days.

(21) Appl. No.: 17/243,368

(22) Filed: Apr. 28, 2021

(65) Prior Publication Data

US 2022/0182478 A1   Jun. 9, 2022

Related U.S. Application Data

(63) Continuation-in-part of application No. 29/761,115, filed on Dec. 7, 2020.

(51) Int. Cl.
| | |
|---|---|
| *H05K 5/00* | (2006.01) |
| *H04M 1/02* | (2006.01) |
| *H05K 5/02* | (2006.01) |
| *G06F 1/16* | (2006.01) |

(52) U.S. Cl.
CPC ............ *H04M 1/0279* (2013.01); *G06F 1/16* (2013.01); *H05K 5/0056* (2013.01); *H05K 5/02* (2013.01)

(58) Field of Classification Search
CPC ....... H04M 1/0279; H04M 1/185; G06F 1/16; G06F 2200/1633; H05K 5/0056; H05K 5/02

USPC ..................................................... 361/679.02
See application file for complete search history.

(56) References Cited

U.S. PATENT DOCUMENTS

| | | | | |
|---|---|---|---|---|
| 2013/0292378 A1* | 11/2013 | Tages | ................... | H04B 1/3888 |
| | | | | 220/4.02 |
| 2013/0331155 A1* | 12/2013 | Tages | ................... | H04M 1/185 |
| | | | | 455/575.8 |
| 2017/0172267 A1* | 6/2017 | Bong | ..................... | A45C 11/00 |
| 2017/0279477 A1* | 9/2017 | Adjesson | .............. | H04M 1/185 |
| 2020/0052732 A1* | 2/2020 | Quinlan | ............... | H04B 1/3888 |

\* cited by examiner

*Primary Examiner* — Anatoly Vortman
*Assistant Examiner* — Zhengfu J Feng

(57) ABSTRACT

The protective corner apparatus is fitted along a portable mobile device, such that the protective corner apparatus provides sufficient protection while maintaining and complementing the core aesthetic design of the portable smart device. The protective corner apparatus contains a first protective layer, and a second protective layer. The first protective layer contains a first backing, a first mounting surface, and at least one retaining hook. The second protective layer contains a second backing, a second mounting surface, a slit, and a retaining ridge. The first protective layer is connected adjacent to the second protective layer. The first mounting surface is positioned on the first backing. The at least one retaining hook is angularly connected to the first backing. The second mounting surface is positioned on the second backing. The retaining ridge is angularly connected to the second backing. The slit is positioned between the second backing and the retaining ridge.

16 Claims, 6 Drawing Sheets

US 11,799,999 B2

PROTECTIVE CORNER APPARATUS FOR PORTABLE MOBILE DEVICES

FIELD OF THE INVENTION

The present invention relates generally to corner covers. More specifically, the present invention is a protective corner apparatus for portable mobile devices

BACKGROUND OF THE INVENTION

Since the invention of the first cellular phone by Martin Cooper in 1973, the devices have come a long way. From texting to applications capable of assisting with health concerns, productivity and games, everyone can agree that cell phones are an integral part of everyday life and will continue to be for a very long time to come. While cell phone functionalities continue to take leaps, the manufactures are also busy with design and aesthetics. In such a competitive market, manufactures can use all the advantage they can get and often success boils down to the allure of the device to attract buyers. From the aluminum frames to the luxurious finish, a substantial RND budget is allocated to the design and presentation of cell phones. As attractive as these devices are, they happen to also be very expensive. Conventional phone cases often cover up the aesthetics of the cell phone.

In the competitive cell phone protective case market, there have not been many successful attempts with the design of cell phone cases that gives a balance between protecting and presenting the intended beauty of the device. There are segments of the industry that are however well covered. The rugged construction and outdoors environment for example is well covered by Otter and other companies.

One segment in particular has been neglected; the segment covering those who love the look of their devices and would rather take on the risk of damage. This segment of consumer would rather not have a protective case on their phones if a bulky case were the only choice available.

Therefore, it is an objective of the present invention to solve these problems and inconveniences. The present invention embodies an electronic device protective case/cell phone case that is slick, low profile, cover less of the device, and offers great protection against little misshapes that results in damages. The key to the invention is the materials and design used. The case will be composed of a form of elastic material (elastomer) or elastic silicon that will offer about 20% stretch without compromising the intended protection and function of the product.

SUMMARY OF THE INVENTION

The present invention is a protective corner apparatus. The protective corner apparatus is fitted along a portable mobile device, such that the protective corner apparatus provides sufficient protection while maintaining and complementing the core aesthetic design of the portable smart device. The protective corner apparatus comprises a first protective layer, and a second protective layer. The first protective layer comprises a first backing, a first mounting surface, and at least one retaining hook. The second protective layer comprises a second backing, a second mounting surface, a slit, and a retaining ridge.

The first protective layer is connected adjacent to the second protective layer. The first mounting surface is positioned on the first backing. The at least one retaining hook is angularly connected to the first backing, where each of the at least one retaining hook extends away from the first mounting surface. The second mounting surface is positioned on the second backing. The retaining ridge is angularly connected to the second backing, where the retaining ridge extends away from the second mounting surface. The slit traverses through the first protective layer and is positioned between the second backing and the retaining ridge.

DETAIL DESCRIPTIONS OF THE INVENTION

All illustrations of the drawings are for the purpose of describing selected versions of the present invention and are not intended to limit the scope of the present invention. The present invention is to be described in detail and is provided in a manner that establishes a thorough understanding of the present invention. There may be aspects of the present invention that may be practiced or utilized without the implementation of some features as they are described. It should be understood that some details have not been described in detail in order to not unnecessarily obscure focus of the invention. References herein to "the preferred embodiment", "one embodiment", "some embodiments", or "alternative embodiments" should be considered to be illustrating aspects of the present invention that may potentially vary in some instances, and should not be considered to be limiting to the scope of the present invention as a whole.

Figure 4:
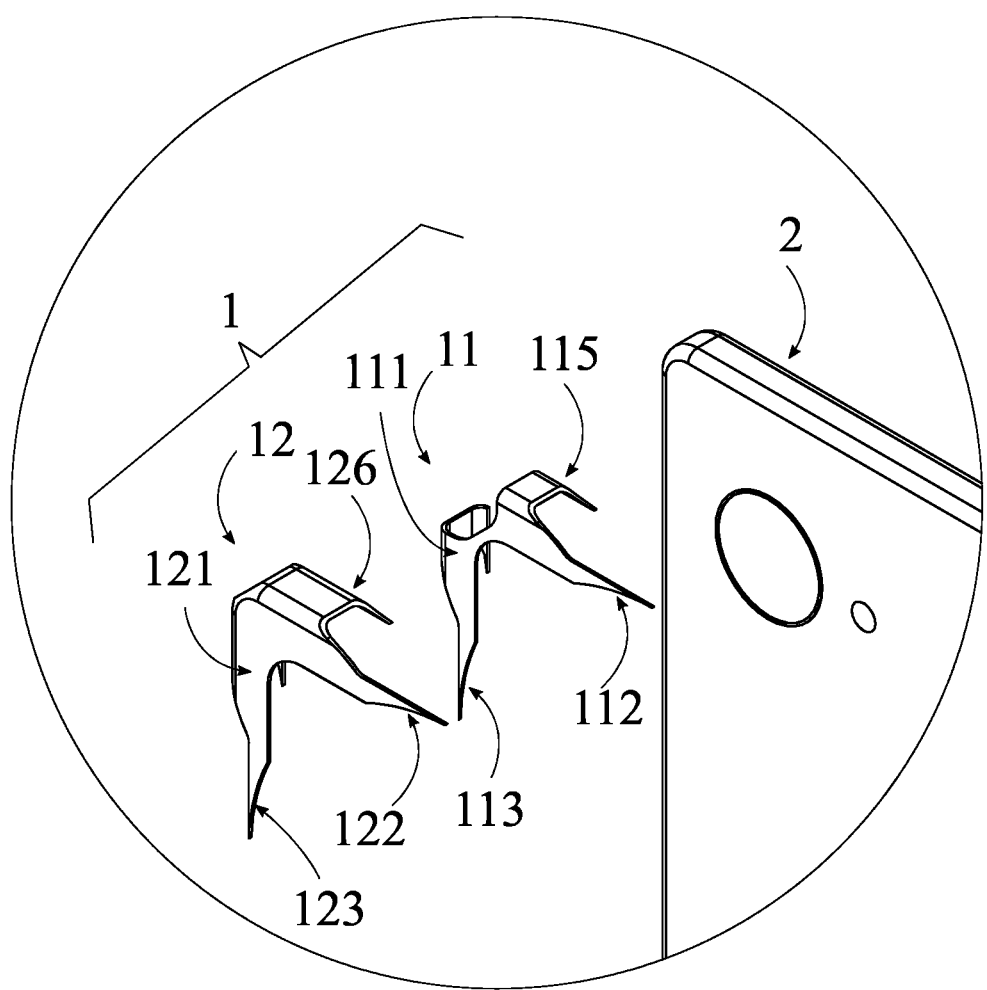
FIG. 4 is a detailed view of the present invention taken along circle A in FIG. 3.
Figure 5:
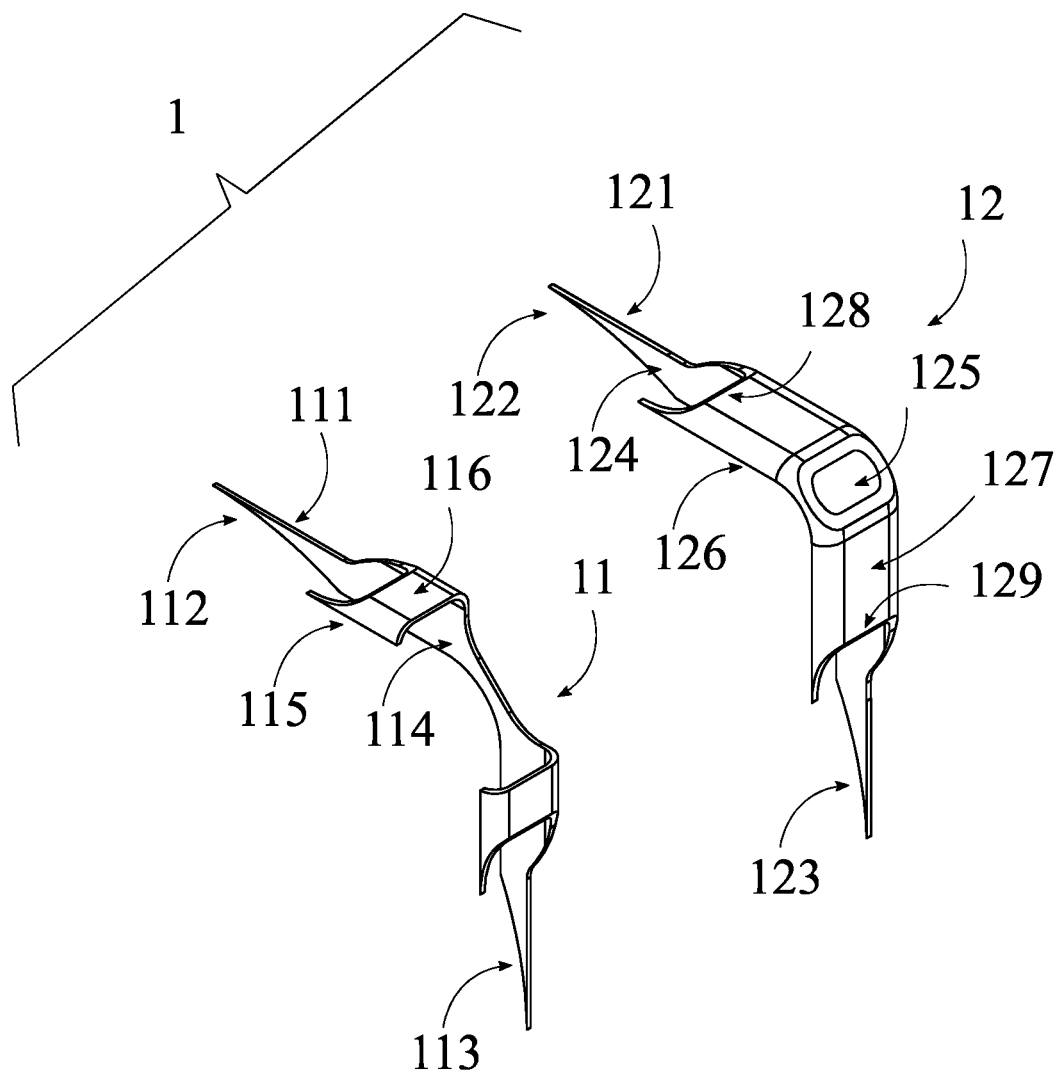
FIG. 5 is a top-front-right perspective view of the present invention.
Figure 6:
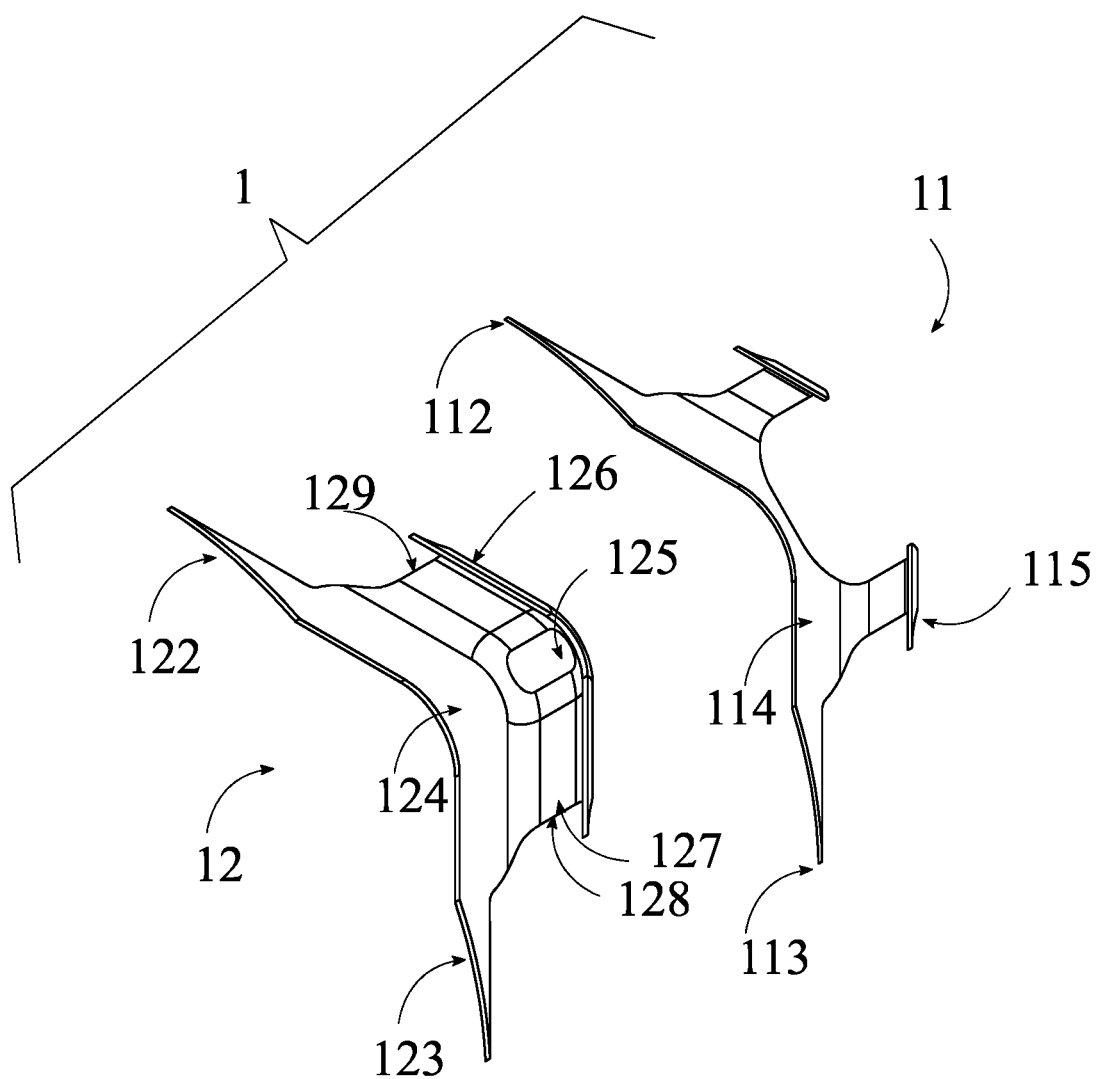
FIG. 6 a bottom-front-left perspective view of the present invention.

The present invention is a protective corner apparatus 1, as shown in FIGS. 1-6. The protective corner apparatus 1 is fitted along a portable mobile device 2, such that the protective corner apparatus 1 provides sufficient protection while maintaining and complementing the core aesthetic design of the portable smart device. The protective corner apparatus 1 comprises a first protective layer 11 and a second protective layer 12, as shown in FIGS. 3-6. The first protective layer 11 comprises a first backing 111, a first mounting surface 114, and at least one retaining hook 115, as shown in FIGS. 5-6. The second protective layer 12 comprises a second backing 121, a second mounting surface 124, a slit 125, and a retaining ridge 126, as shown in FIGS. 5-6. In the preferred embodiment of the present invention, the first protective layer 11 may take the form of the exterior or interior layer of the protective corner apparatus 1. In the preferred embodiment of the present invention, the first protective layer 11 and the second protective layer 12 may take the form of an elastic construction, semi-elastic construction, rigid construction, or a combination of the aforementioned materials listed.

Figure 1:
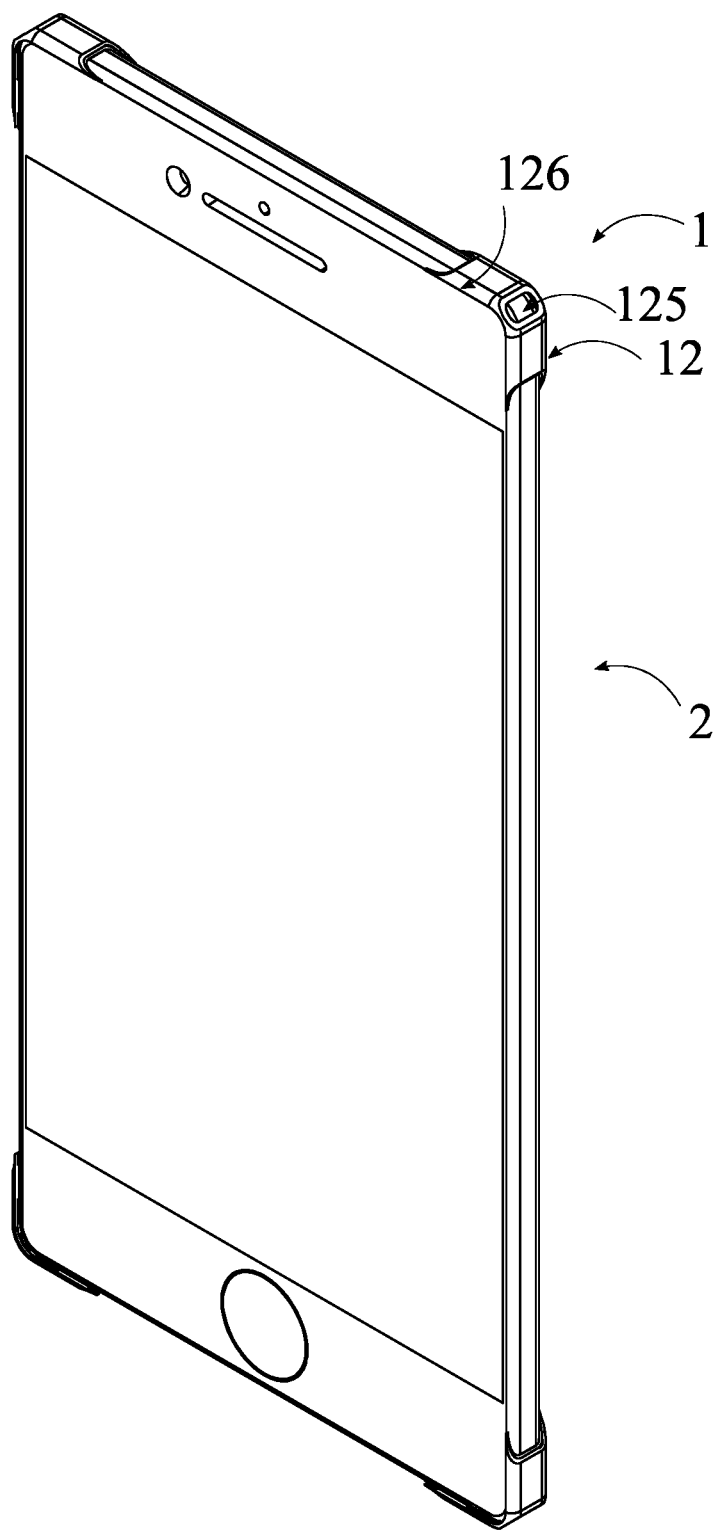
FIG. 1 is a top-front perspective view of the present invention installed along a portable mobile device.
Figure 2:
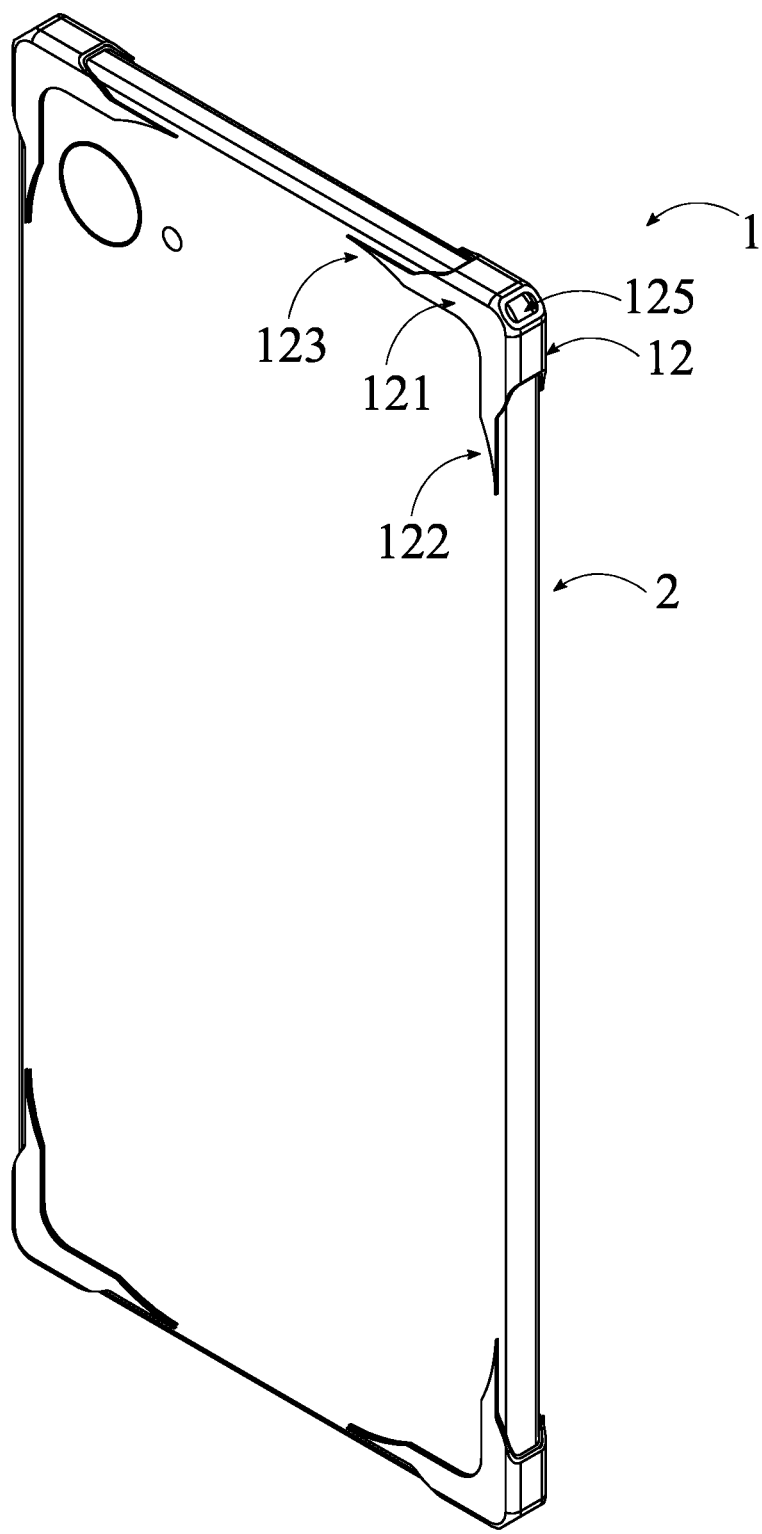
FIG. 2 is a top-rear perspective view of the present invention along the portable mobile device.
Figure 3:
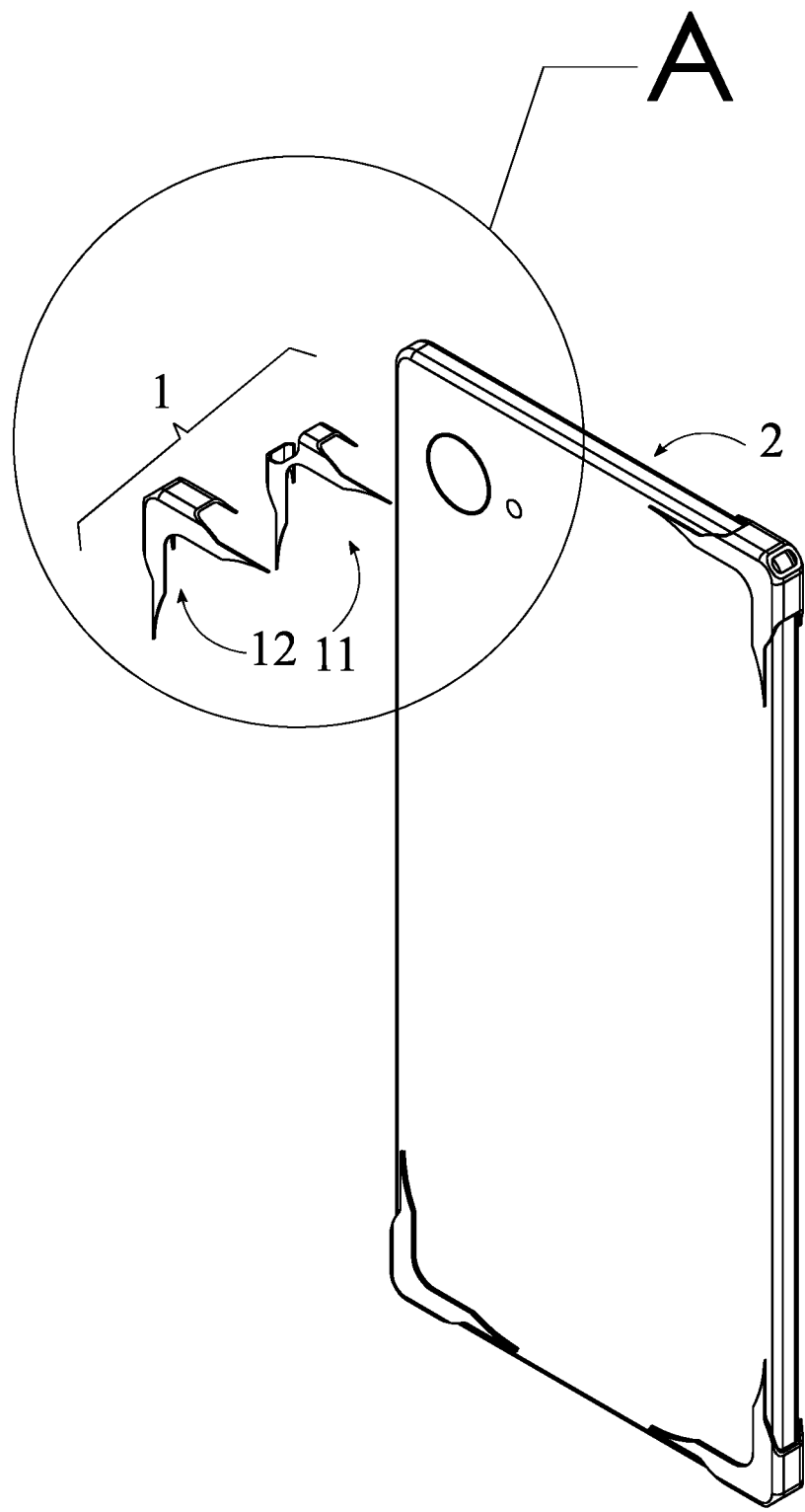
FIG. 3 is an exploded view of the present invention.

In the preferred embodiment of present invention, the first protective layer 11 is connected adjacent to the second protective layer 12, as shown in FIGS. 1-2. The first mounting surface 114 is positioned on the first backing 111. The at least one retaining hook 115 is angularly connected to the first backing 111, where each of the at least one retaining hook 115 extends away from the first mounting surface 114. The second mounting surface 124 is positioned on the second backing 121. The retaining ridge 126 is angularly connected to the second backing 121, where the retaining ridge 126 extends away from the second mounting surface 124. The slit 125 traverses through the first protective layer 11 and is positioned between the second backing 121 and the retaining ridge 126. The protective corner apparatus 1 is fitted along the corners of the portable mobile device 2. The protective corner apparatus 1 will cover less of the device allowing most of the device design attributes to be seen and felt. More specifically, the protective corner apparatus 1 will cover a small fraction of the device surface and is universal for the vast majority of smartphones. In various embodiments, the protective corner apparatus 1 may also be adapted for tablets, e-readers, and any other suitable portable mobile device 2. The protective corner apparatus 1 is lightweight, utilizing less material than a conventional portable mobile device 2 case. In the preferred embodiment of the present invention, the protective corner apparatus 1 is made out of a lightweight, shockproof, and durable material, including, but not limited to polycarbonate, silicon, ABS, aluminum, stainless steel, rubber, leather, synthetic leather, santoprene, neoprene or any other suitable material.

In the preferred embodiment of the present invention, the at least one retaining hook 115 is perpendicularly connected to the first backing 111, where each of the at least one retaining hook 115 extends away from the first mounting surface 114. In the preferred embodiment of the present invention, the at least one retaining hook 115 secures along the front side of the portable mobile device 2.

In the preferred embodiment of the present invention, the retaining ridge 126 is perpendicularly connected to the second backing 121, where the retaining ridge 126 extends away from the second mounting surface 124.

In the preferred embodiment of the present invention, the second protective layer 12 comprises a first sidewall 116, as shown in FIG. 5. The first sidewall 116 is positioned between the first backing 111 and the at least one retaining hook 115. The first sidewall 116 is angularly connected to the first backing 111 and the at least one retaining hook 115. The first sidewall 116 is perpendicularly connected to the first backing 111 and the at least one retaining hook 115. In the preferred embodiment of the present invention, the first sidewall 116 secures along the sides of the portable mobile device 2.

In the preferred embodiment of the present invention, the first protective layer 11 comprises a second sidewall 127, as shown in FIGS. 5-6. The second sidewall 127 is positioned between the second backing 121 and the retaining ridge 126. The second sidewall 127 is angularly connected to the second backing 121 and the retaining ridge 126. The second sidewall 127 is perpendicularly connected to the second backing 121 and the retaining ridge 126. The second sidewall 127 comprises a first end 128 and a second end 129. The first end 128 and the second end 129 are terminally positioned opposite to each other along the second sidewall 127. The slit 125 is positioned between the first end 128 and the second end 129. In the preferred embodiment of the present invention, the second sidewall 127 secures along the first side wall.

In the preferred embodiment of the present invention, the first backing 111 comprises a first extension 112 and a second extension 113, as shown in FIGS. 4-6. The first extension 112 and the second extension 113 are positioned terminally opposite to each other along the first backing 111. In the preferred embodiment of the present invention, the first extension 112 and the second extension 113 serves as extended bodies that provide more surface area for the first mounting surface 114 to secure along the portable mobile device 2.

In the preferred embodiment of the present invention, the second backing 121 comprises a third extension 122 and a fourth extension 123, as shown in FIGS. 4-6. The third extension 122 and the fourth extension 123 is positioned terminally opposite to each other along the second backing 121. In the preferred embodiment of the present invention, the third extension 122 and the fourth extension 123 serves as extended bodies that provide more surface area for the second mounting surface 124 to correspond to the profile of the first extension 112 and the second extension 113.

In the preferred embodiment of the present invention, the second protective layer 12 is made out of an elastic material including, but not limited to polycarbonate, silicon, rubber, santoprene, neoprene or any other suitable elastomer material. In the preferred embodiment of the present invention, the first protective layer 11 is made out of a rigid material including, but not limited to polycarbonate, ABS, aluminum, stainless steel, leather, synthetic leather or any other suitable material. In another embodiment, the second protective layer 12 is made out of a rigid material including, but not limited to polycarbonate, ABS, aluminum, stainless steel, leather, synthetic leather or any other suitable material. In another embodiment, the first protective layer 11 is made out of an elastic material including, but not limited to polycarbonate, silicon, rubber, santoprene, neoprene or any other suitable elastomer material.

The protective corner apparatus 1 further comprises an adhesive 13. The adhesive 13 is distributed about the first mounting surface 114. The adhesive 13 is distributed about the second mounting surface 124. The adhesive 13 allows the protective corner apparatus 1 to secure along the corners of the portable mobile device 2.

Although the invention has been explained in relation to its preferred embodiment, it is to be understood that many other possible modifications and variations can be made without departing from the spirit and scope of the invention as hereinafter claimed.

What is claimed is:

1. A protective corner apparatus comprising:
   a first protective layer;
   a second protective layer;
   the first protective layer comprising a first backing, a first mounting surface, and at least one retaining hook;
   the second protective layer comprising a second backing, a second mounting surface, a slit, and a retaining ridge;
   the first protective layer is connected adjacent to the second protective layer;
   the first mounting surface being positioned on the first backing;
   the at least one retaining hook being angularly connected to the first backing, wherein each of the at least one retaining hook extends away from the first mounting surface;
   the second mounting surface being positioned on the second backing;
   the retaining ridge being angularly connected to the second backing, wherein the retaining ridge extends away from the second mounting surface; and
   the slit traversing through the first protective layer and being positioned between the second backing and the retaining ridge.

2. The protective corner apparatus as claimed in claim 1 comprising:

the at least one retaining hook being perpendicularly connected to the first backing, wherein each of the at least one retaining hook extends away from the first mounting surface.

3. The protective corner apparatus as claimed in claim 1 comprising:
the retaining ridge being perpendicularly connected to the second backing, wherein the retaining ridge extends away from the second mounting surface.

4. The protective corner apparatus as claimed in claim 1 comprising:
the second protective layer comprising a first sidewall;
the first sidewall being positioned between the first backing and the at least one retaining hook; and
the first sidewall being angularly connected to the first backing and the at least one retaining hook.

5. The protective corner apparatus as claimed in claim 4 comprising:
the first sidewall being perpendicularly connected to the first backing and the at least one retaining hook.

6. The protective corner apparatus as claimed in claim 1 comprising:
the first protective layer comprising a second sidewall;
the second sidewall being positioned between the second backing and the retaining ridge; and
the second sidewall being angularly connected to the second backing and the retaining ridge.

7. The protective corner apparatus as claimed in claim 6 comprising:
the second sidewall being perpendicularly connected to the second backing and the retaining ridge.

8. The protective corner apparatus as claimed in claim 6 comprising:
the second sidewall comprising a first end and a second end;
the first end and the second end being terminally positioned opposite to each other along the second sidewall; and
the slit being positioned between the first end and the second end.

9. The protective corner apparatus as claimed in claim 1 comprising:
the first backing comprising a first extension and a second extension; and
the first extension and the second extension being positioned terminally opposite to each other along the first backing.

10. The protective corner apparatus as claimed in claim 1 comprising:
the second backing comprising a third extension and a fourth extension; and
the third extension and the fourth extension being positioned terminally opposite to each other along the second backing.

11. The protective corner apparatus as claimed in claim 1, wherein the second protective layer is made out of an elastic material.

12. The protective corner apparatus as claimed in claim 1, wherein the first protective layer is made out of a rigid material.

13. The protective corner apparatus as claimed in claim 1, wherein the second protective layer is made out of a rigid material.

14. The protective corner apparatus as claimed in claim 1, wherein the first protective layer is made out of an elastic material.

15. The protective corner apparatus as claimed in claim 1 comprising:
an adhesive; and
the adhesive being distributed about the first mounting surface.

16. The protective corner apparatus as claimed in claim 1 comprising:
an adhesive; and
the adhesive being distributed about the second mounting surface.

* * * * *